US012710479B2

(12) United States Patent
Schnacke et al.

(10) Patent No.: US 12,710,479 B2
(45) Date of Patent: Aug. 18, 2026

(54) METHOD FOR LOW POWER MONITORING OF SYSTEM PARAMETERS

(71) Applicant: Analog Devices, Inc., Wilmington, MA (US)

(72) Inventors: Ryan Christopher Schnacke, Sachse, TX (US); James Michael Douglass, Lewisville, TX (US); Erik Steven Wheeler, Farmers Branch, TX (US)

(73) Assignee: Analog Devices, Inc., Wilmington, MA (US)

(*) Notice: Subject to any disclaimer, the term of this patent is extended or adjusted under 35 U.S.C. 154(b) by 471 days.

(21) Appl. No.: 18/028,479

(22) PCT Filed: Sep. 3, 2021

(86) PCT No.: PCT/US2021/049150
§ 371 (c)(1),
(2) Date: Mar. 24, 2023

(87) PCT Pub. No.: WO2022/072123
PCT Pub. Date: Apr. 7, 2022

(65) Prior Publication Data

US 2023/0366944 A1 Nov. 16, 2023

Related U.S. Application Data

(60) Provisional application No. 63/086,314, filed on Oct. 1, 2020.

(51) Int. Cl.
*G01R 31/385* (2019.01)
*G01R 31/392* (2019.01)

(52) U.S. Cl.
CPC ......... *G01R 31/385* (2019.01); *G01R 31/392* (2019.01)

(58) Field of Classification Search
USPC .......... 702/63
See application file for complete search history.

(56) References Cited

U.S. PATENT DOCUMENTS 6,002,260 A 12/1999 Lau et al.
9,936,009 B2 4/2018 Patil et al.
(Continued)

FOREIGN PATENT DOCUMENTS

CN 104903738 9/2015
CN 110008078 7/2019
(Continued)

OTHER PUBLICATIONS

"International Application Serial No. PCT/US2021/049150, International Search Report mailed Dec. 21, 2021", 3 pgs.
(Continued)

*Primary Examiner* — Oluseye Iwarere
(74) *Attorney, Agent, or Firm* — Schwegman Lundberg & Woessner, P.A.

(57) ABSTRACT

Battery monitoring techniques, which consume low amounts of power, are described herein. The battery monitoring techniques can be used when the host device (e.g., electric vehicle) is not operating, thus providing a time to use low power techniques. Measurement devices can measure system parameters when a host processor is off or in a low power mode using a heartbeat (HB) sequencing technique. Based on the HB message, the host processor can be alerted and awakened when a fault is detected.

21 Claims, 8 Drawing Sheets

(56) References Cited

U.S. PATENT DOCUMENTS

2001/0045780 A1* 11/2001 Gottlieb ............ G01R 31/3648 307/66
2010/0078016 A1* 4/2010 Andrieux .......... H01M 10/4257 340/657
2015/0102820 A1 4/2015 Mizobe et al.
2015/0168497 A1* 6/2015 Tabatowski-Bush ..... B60L 3/04 324/426
2015/0341447 A1 11/2015 Patil
2015/0370312 A1 12/2015 Desposito et al.
2018/0006910 A1 1/2018 Yin et al.
2018/0042559 A1* 2/2018 Cabrera, Jr ......... G06F 3/04847
2018/0227649 A1 8/2018 Corbin et al.
2020/0264945 A1* 8/2020 Gangopadhyay ... G06F 11/0739

FOREIGN PATENT DOCUMENTS

KR 20120049224 A 5/2012
KR 20130095424 A 8/2013
KR 20180135234 A 12/2018
WO WO-2022072123 A1 4/2022

OTHER PUBLICATIONS

"International Application Serial No. PCT/US2021/049150, Written Opinion mailed Dec. 21, 2021", 5 pgs.
"International Application Serial No. PCT/US2021/049150, International Preliminary Report on Patentability mailed Apr. 13, 2023", 7 pgs.
"Korean Application Serial No. 10-2023-7009372, Notice of Preliminary Rejection mailed Apr. 17, 2025", W/English Translation, 16 pgs.
"Korean Application Serial No. 10-2023-7009372, Response filed Jun. 16, 2025 to Notice of Preliminary Rejection mailed Apr. 17, 2025", w/ English translation, 16 pgs.
"Chinese Application Serial No. 202180067494.3, Office Action mailed Dec. 31, 2025", w/ English translation, 22 pgs.
"Chinese Application Serial No. 202180067494.3, Response filed Mar. 6, 2026 to Office Action mailed Dec. 31, 2025", w/ English claims, 13 pgs.

* cited by examiner

| Bit Meaning | BYTE | bit7 | bit6 | bit5 | bit4 | bit3 | bit2 | bit1 | bit0 |
|---|---|---|---|---|---|---|---|---|---|
| | 0 | Device Down-Count[7:0] | | | | | | | |
| | 1 | CMF_G DVP | CMF_G DVN | CMF_G OV | CMF_G UV | CMF_C DVP | CMF_C DVN | CMF_C OV | CMF_C UV |

FIG. 5

METHOD FOR LOW POWER MONITORING OF SYSTEM PARAMETERS

CLAIMS OF PRIORITY

This patent application is a National Stage of PCT Application Serial Number PCT/US2021/049150, titled "METHOD FOR LOW POWERING MONITORING OF SYSTEM PARAMETERS," filed on Sep. 3, 2021, and was published as WO 2022/072123 A1 on Apr. 7, 2022, which claims the benefit of priority to U.S. Provisional Patent Application Ser. No. 63/086,314, titled "METHOD FOR LOW POWERING MONITORING OF SYSTEM PARAMETERS," filed on Oct. 1, 2020, which are hereby incorporated by reference herein in their entirety.

TECHNICAL FIELD

The present disclosure generally relates to low power monitoring of batteries in a Battery Management System (BMS).

BACKGROUND

Generally, a BMS in an electric vehicle (EV) monitors battery packs when the EV is being operated (e.g., being driven or otherwise occupied with the "ignition" state in the "on" or "accessory" position or being charged). But defects or damage in battery cells can lead to anomalies such as thermal runaway or failure even when the EV is in not being operated, such as when it is parked, turned off, or disconnected from a charging source.

Thus, there is a need for the ability to monitor battery packs during long periods of inactivity. In one approach, continuous battery-monitoring techniques can be used, but they generally consume significant amounts of power. Periodic monitoring, which is managed by a (relatively high power) host processor, can consume appreciable/undesirable decrease in state-of-charge because the power consumption of the host processor is significant even with a low duty cycle.

BRIEF DESCRIPTION OF THE DRAWINGS

Various ones of the appended drawings merely illustrate example embodiments of the present disclosure and should not be considered as limiting its scope.

FIG. 5 illustrates an example of a structure of a HB message.

DETAILED DESCRIPTION

Figure 1:
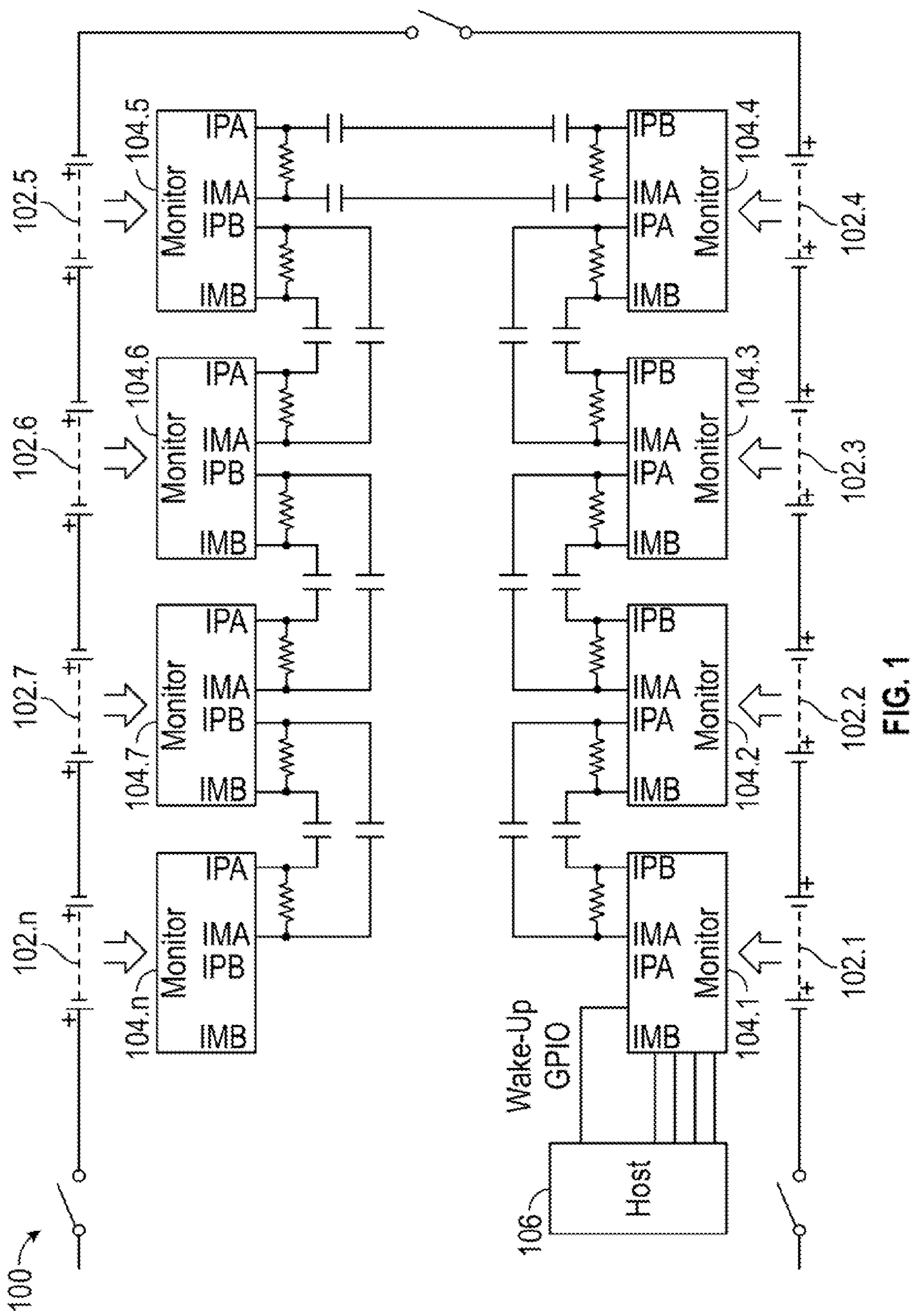
FIG. 1 illustrates a block diagram of a Battery Management System (BMS).

Battery monitoring techniques, which consume low amounts of power, are described herein. The battery monitoring techniques may be used when the host application (e.g., EV) is not operating, thus providing a benefit to use low power techniques. The battery monitoring techniques described herein may employ a host processor, a plurality of measurement devices, and an optional bridging device to monitor system parameters. The host processor may consume a significant amount of power relative to the measurement devices and bridging device; therefore, the measurement devices may measure system parameters when the host processor is off or in a low power mode (e.g., sleep mode) using a heartbeat (HB) sequencing technique. A HB message generated by the HB sequencing technique may include information about each of the battery modules coupled to the measurement devices. Based on the HB message, the host processor may be alerted and awakened (or powered up) when a fault is detected.

This document describes a method to monitor a battery in a reduced energy consumption mode using a plurality of monitors. At a first monitor: transitioning from a reduced energy consumption state; performing a first measurement of a first battery module coupled to the first monitor; generating a heartbeat message; encoding information regarding the first measurement into the heartbeat message; adjusting a count in the heartbeat message in response to no error being detected by the first monitor and not adjusting the count in response to an error being detected by the first monitor; transmitting the heartbeat message to a second monitor; and re-entering the reduced energy consumption state. At a second monitor; receiving the heartbeat message from the first monitor; performing a second measurement of a second battery module coupled to the second monitor; encoding information regarding the second measurement into the heartbeat message; adjusting the count in the heartbeat message in response to no error being detected by the second monitor and not adjusting the count in response to an error being detected by the second monitor. At a watchdog device: receiving the heartbeat message; and based on the count in the heartbeat message, determining whether to generate an alert for a host processor.

This document also describes method to monitor a battery module in a reduced energy consumption mode, the method comprising: transitioning to a reduced energy consumption state; based on a timer, transitioning from the reduced energy consumption state and initiating a heartbeat sequence including performing a measurement on the battery module and comparing the measurement to a threshold; encoding a heartbeat message based on the comparison of the measurement to the threshold; determining whether an error condition exists; adjusting a count in the heartbeat message in response to no error condition being determined and not adjusting the count in response to the error condition being determined; transmitting the heartbeat message to another monitor; and re-entering the reduced energy consumption state.

This document further describes a battery management system including a host processor, a plurality of monitors coupled to respective battery modules of a battery, and a watchdog device coupled to the plurality of monitors. The watchdog device is configured to: receive a heartbeat message, the heartbeat message including measurement information from a plurality of monitors and a count value indicating a number of monitors experiencing an error condition; in response to the count value indicating that at least one monitor is experiencing the error condition, generating an alert for the host processor to exit a reduced energy consumption mode; and in response to the count value indicating that no monitor is experiencing the error condition, maintaining the host processor in the reduced energy consumption mode.

FIG. 1 illustrates a block diagram of a Battery Management System (BMS) 100. The BMS 100 may include a plurality of battery modules 102.1-102.*n*, each including a plurality of battery cells. For example, the battery modules 102.1-102.*n* may be lithium-ion batteries. Batteries with different specifications, sizes, and shapes may be used. Each module may be coupled to a respective monitor 104.1-104.*n*.

Each monitor 104.1-104.*n* may be coupled to a respective battery module 102.1-102.*n* and may monitor various conditions or properties of the battery module 102.1-102.*n*. Each monitor 104.1-104.*n* may be provided as an integrated circuit, which can include a monolithically integrated BMS circuit or an integrated module including multiple integrated circuit die or other circuit elements within a commonly-shared integrated circuit device package, as illustrative examples.

The monitors 104.1-104.*n* may include a variety of sensors. The monitors 104.1-104.*n* may sample the battery voltage to monitor the battery level. The monitors 104.1-104.*n* may also monitor current of the battery module and the external surface temperature.

The monitors 104.1-104.*n* may communicate with a host processor 106 through a wired communication interface in this example. For example, the communication interface may include isolated (transformer) communication cabling, such as implementing an Isolated Serial Peripheral Interface (isoSPI). The communication cabling may be connected in a serial fashion from module to module, e.g., daisy chained from monitor to monitor (104.1-104.*n*) with the last BMS monitor (e.g., 104.*n*) providing a termination point for the cabling.

Figure 2:
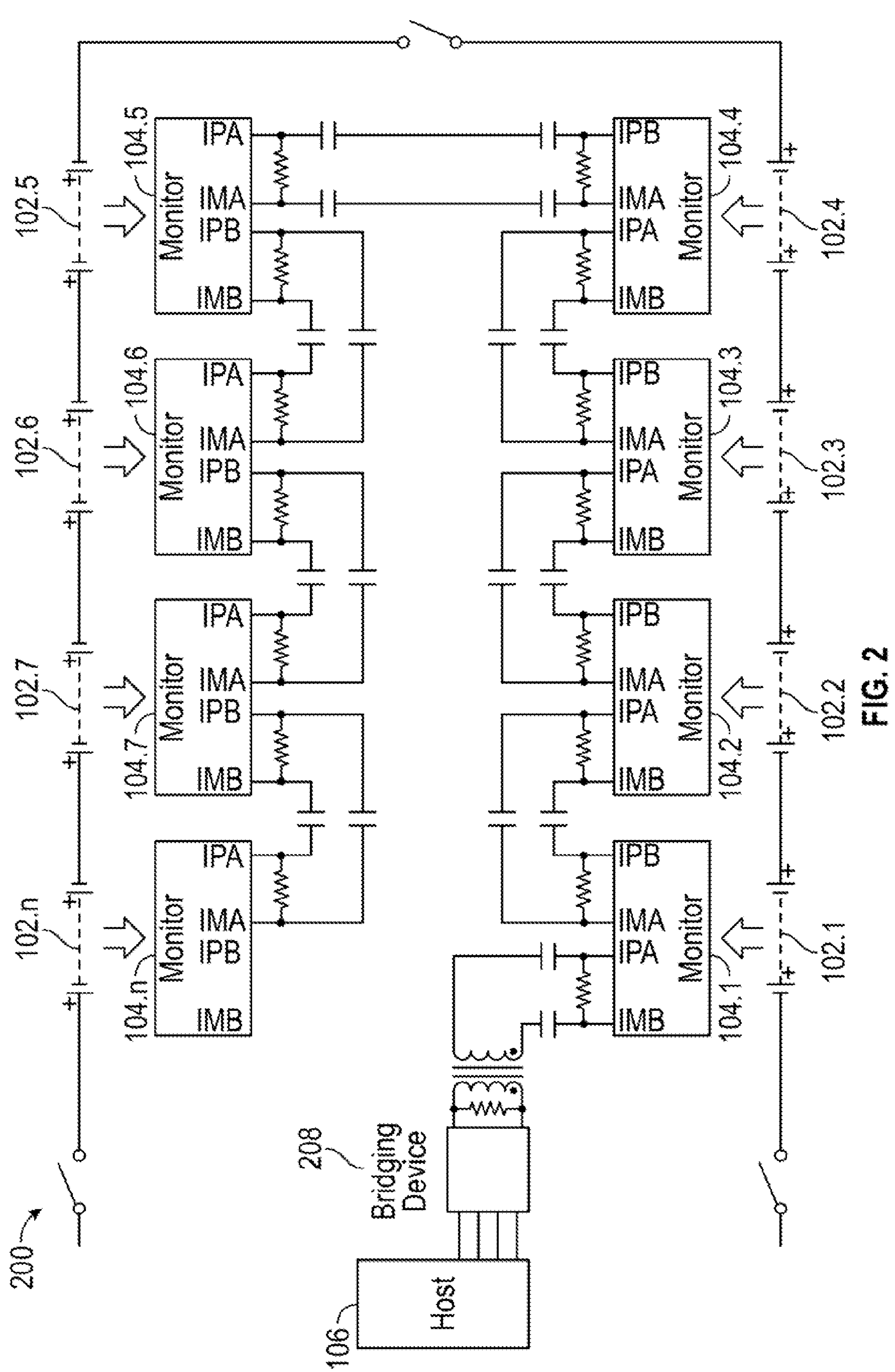
FIG. 2 illustrates a block diagram of a wired battery management system illustrates a block diagram of a BMS with a bridging device.

FIG. 2 illustrates a block diagram of a BMS 200 with a bridging device. The BMS 200 may include a plurality of battery modules 102.1-102.*n* coupled to a plurality of monitors 104.1-104.*n*, as described above. The BMS 200 may also include a host processor 106, as described above. The BMS 200 may further include a bridging device 208. The bridging device 208 may be placed between the host processor 106 and the first monitor 104.1. For example, the first monitor 104.1 may be coupled to the bridging device 208 with an isoSPI, and the bridging device 202 in turn may be coupled to the host processor 106 with a SPI.

Figure 3:
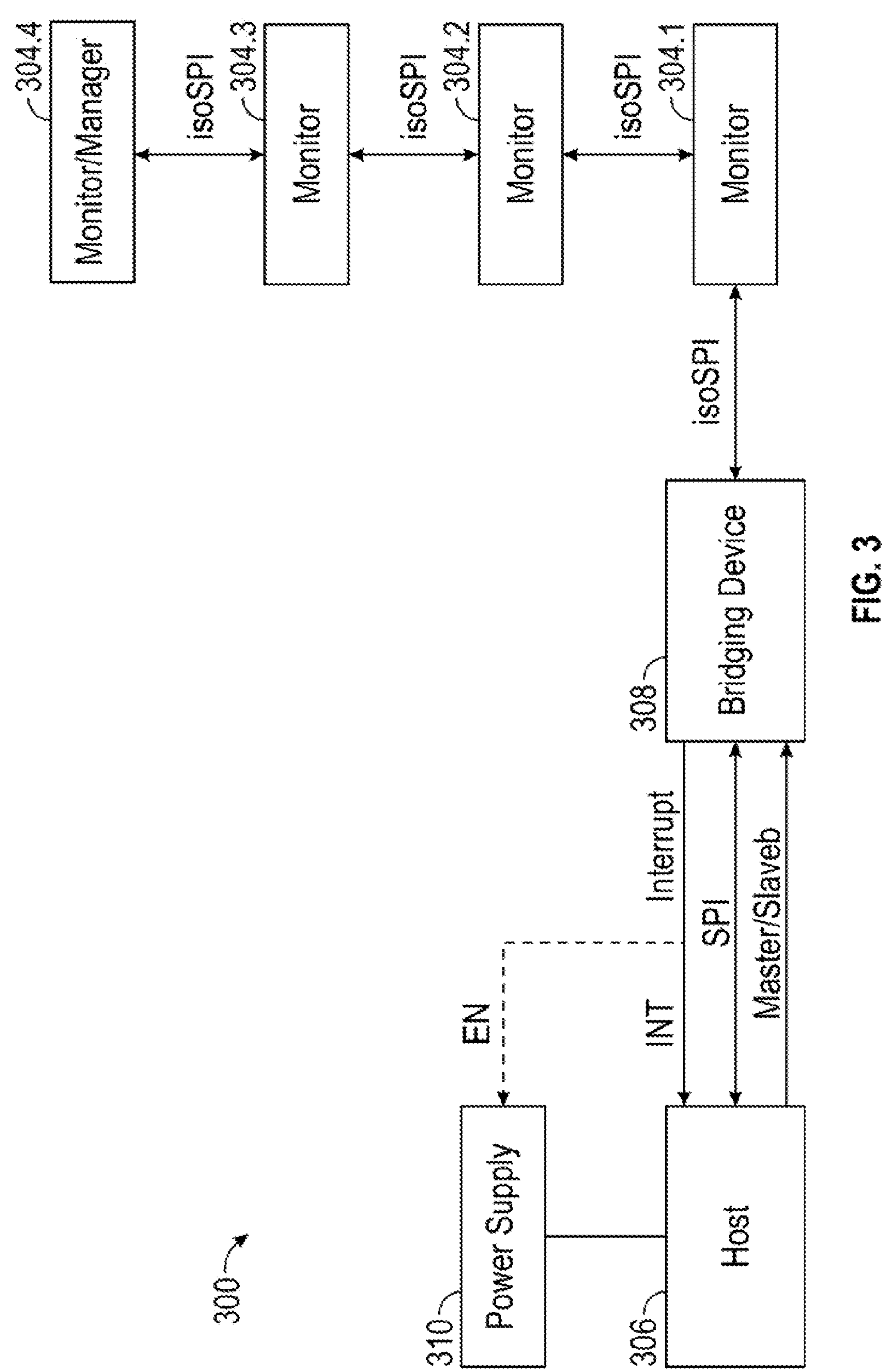
FIG. 3 illustrates a block diagram of a BMS with a bridging device operating in reduced energy consumption mode.

FIG. 3 illustrates a block diagram of a BMS 300 with a bridging device operating in reduced energy consumption mode. BMS 300 may include a plurality of monitors 304.1-304.4, a host processor 306, a bridging device 308, and a power supply 310. Four monitors 302.1-302.4 are shown for illustration purposes only; other number of monitors may be used. Here, one of the monitors may be configured to also operate as a manager (also referred to as monitor/manager 304.4). The monitor/manager 304.4 may be located at the opposite end of the host processor 306 in the daisy chain. During reduced energy consumption mode, the monitors 304.1-304.4, as well as the host processor 306 and the bridging device 308, may operate in a reduced energy consumption state.

During reduced energy consumption mode, the monitor/manager 304.4 may, based on a schedule, initiate a measurement sequence (also referred to as a HB message sequence) at a defined time interval (referred to as HB interval). The monitor/manager 304.4 may use a HB timer and when the timer expires, it may wake up from its reduced energy consumption state and begin by performing various measurements of system parameters for its coupled battery module or cells. The monitor/manager 304.4 may compare those measurements to predefined thresholds. After the monitor/manager 304.4 completes its measurements and comparisons, it may send a communication message to the next monitor 304.3 in the communication chain and may then revert to its reduced energy consumption state and restart its HB timer. The timing of the HB timer may be configurable (e.g., every 1-60 seconds). Moreover, the HB message sequence may utilize the same communication link used during normal high-power operational mode to communicate with the monitors 304.1-304.4. No additional communication path may be needed for the HB messaging.

The communication message may be encoded as a recognizable command. The command may wake the next monitor (e.g., 304.3) and cause it to initiate the same measurement and comparison operations. The command message may also include information regarding the measurements and comparisons performed by the monitor/manager 304.4. The receiving monitor 304.3 may then add its measurements and comparisons to the message and send it to the next monitor 304.2 and the sequence may continue until the last monitor 304.1 completes its sequence.

If any measurement exceeds a predefined threshold in any monitor 304.1-304.4, a flag bit or field of bits may be set high in the message by the respective monitor. Likewise, if a monitor 304.1-304.4 experiences a self-diagnostic error, a flag or field of bits may be set in the message. The message may also contain information about the count of devices that have successfully completed measurements and comparisons without exceeding any thresholds or experiencing any diagnostic errors. A monitor 304.1-304.4 may decrement a device counter if it is not experiencing any errors and may not decrement the device counter if it is experiencing some type of error (e.g., exceeding a threshold or diagnostic error).

After the measurement sequence has proceeded through all the monitors, the HB message may be received by a watchdog device. The watchdog device may be implemented as a separate bridging device 308 (as shown in FIG. 3). Alternatively, the last monitor 304.1 may be configured as the watchdog device. The watchdog device may receive the communication message and may analyze and qualify the contents of the message for expected values. Typically, the watchdog device would expect no indications of thresholds exceeded or diagnostic errors and would expect the device count to indicate that all monitors successfully performed the measurements and comparisons. However, if the message includes an indication that one or more monitors showed an error, the watchdog device would alert the host processor 306 (e.g., via the bridging device 308). For example, the watchdog device may transmit an interrupt signal to the host processor to wake the host processor from sleep mode. In another example, the watchdog device may transmit an enable signal to the power supply 310 to supply power to the host processor. Consequently, the host processor 306 may interrogate the monitors 304.1-304.4 for more information regarding the detected error(s).

Moreover, the watchdog device may also include a timer (e.g., a timeout monitor) and if the watchdog device does not receive the HB message within a predefined time (e.g., a watchdog timeout), the watchdog device may alert the host processor accordingly by waking or powering it up.

Figure 4:
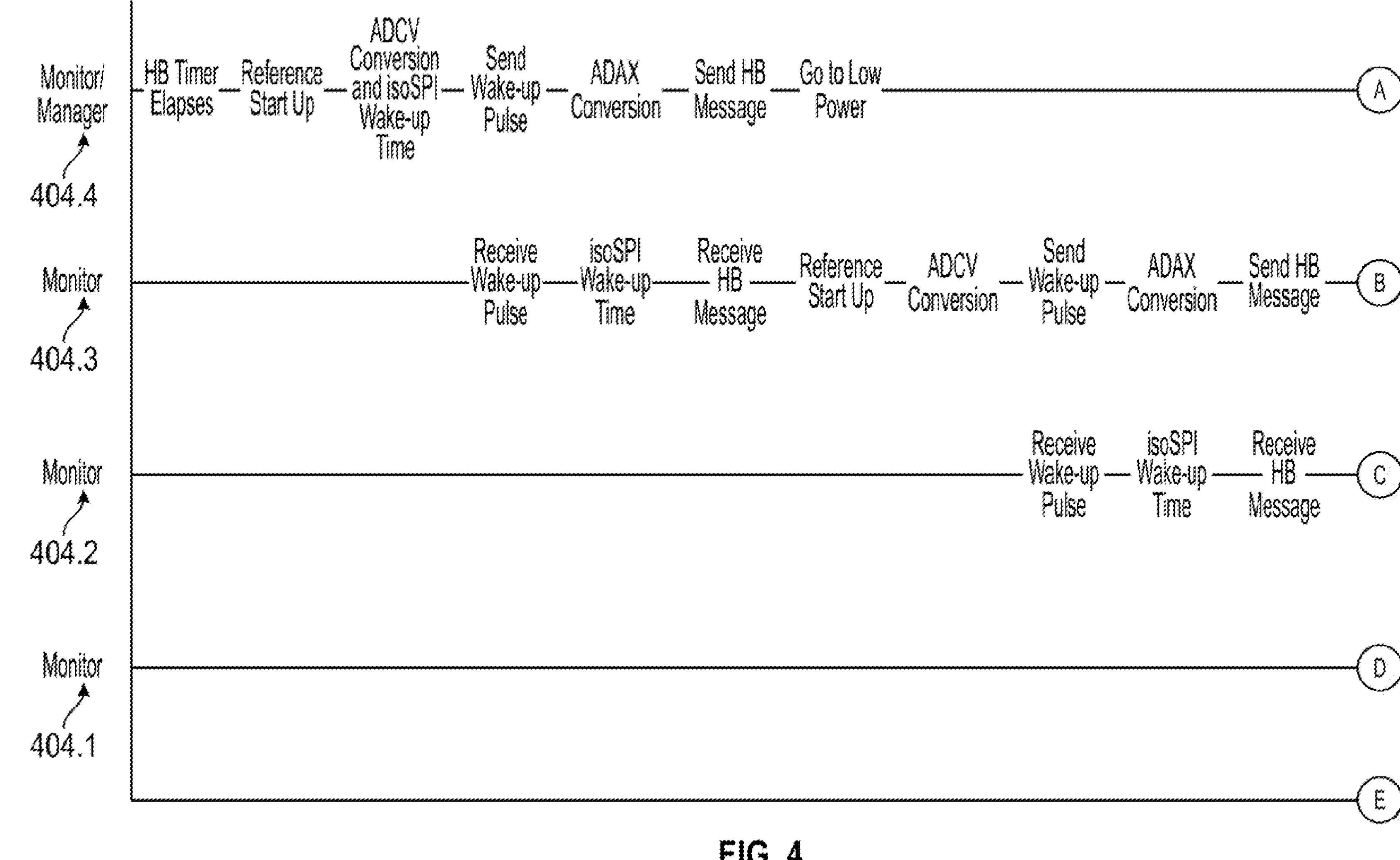
FIG. 4 illustrates a timing diagram of BMS monitor operations.
Figure 4:
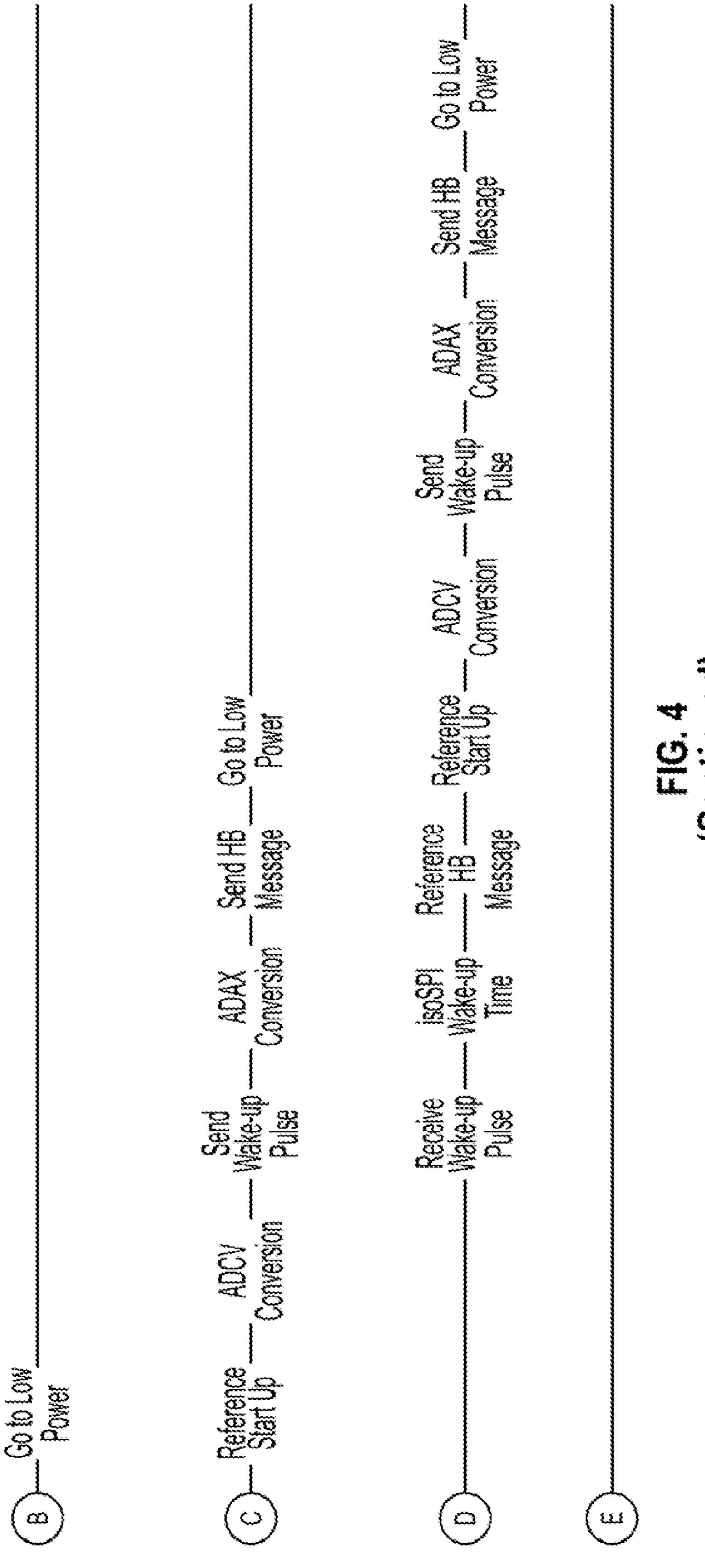

FIG. 4 illustrates a timing diagram of BMS monitor operations. Here, four monitors 404.1-40.4 are shown, but other number of monitors may be used. Monitor 404.4 (e.g., the monitor on the opposing end of the daisy chain) may also be configured as a manager, as described above. The monitor/manager 404.4 may be operating in a reduced energy consumption state and then the HB timer may elapse. At this programmed interval, the monitor/manager 404.4 may power up and enable its reference. Next, battery cell measurement, conversion, and comparison may be performed (ADCV).

The monitor/manager 404.4 may also send a wake-up pulse to the next monitor 404.3 at this point. Monitor 403.3 may receive the wake-up pulse and may power up its isoSPI. In the meantime, monitor/manager 404.4 may perform GPIO measurement, conversion, and comparison (ADAX). The monitor/manager 404.4 may then generate the HB command, as described herein, with the results of the measurement, conversion, and comparisons. If no threshold was violated, monitor/manager 404.4 may send the HB message with no flags raised. If a threshold was violated, the monitor/manager 404.4 may send the HB message with the appropriate flag raised (e.g., fault signal). The monitor/manager 404.4 may also decrement the device counter if no flags are raised by monitor/manager 404.4. If flags were raised, monitor/manager 404.4 may refrain from decrementing the device counter. The monitor/manager 404.4 may send the command over the isoSPI to the next monitor 404.3. The monitor/manager 404.4 may then re-enter the reduced energy consumption state.

Monitor 404.3 and the other monitors 404.2, 404.1 may continue with the HB sequence, as shown, until the last monitor 404.2 completes its part of the sequence. Each monitor may maintain flags raised by any preceding device. The HB message may then be analyzed by the watchdog device (e.g., a bridging device or the last monitor 404.1).

The host processor may initiate reduced energy consumption mode (also referred to as low power cell monitoring (LPCM)), instructing the devices to enter reduced energy consumption mode. The host processor may also enter reduced energy consumption mode. In an example, the host processor may stay in operational mode for the first or more cycles of the HB messaging to ensure the messaging is operational. After receiving the first or more successful HB message, the host processor may then enter reduced energy consumption mode.

FIG. 5 illustrates an example of a structure of a HB message. Here, the payload of the HB message is shown. In this example, the following thresholds may be provided for monitoring: GPIO delta voltage in positive direction (CMF_GDVP); GPIO delta voltage in negative direction (CMF_GDVN); GPIO over voltage (CMF_GOV); GPIO under voltage (CMF_GUV); Cell delta voltage in positive direction (CMF_CDVP); Cell delta voltage in negative direction (CMF_CDVN); Cell over voltage (CMF_COV); Cell under voltage (CMF_CUV).

When a monitor encounters any of these situations, it may raise the corresponding flag(s) in the HB message payload. Each monitor may maintain the flags raised by any of the devices before it.

Before entering reduced energy consumption mode, the host processor may configure the threshold values used in each of the monitors. In an example, the host processor may effectively disable the OV and delta voltage positive-direction comparisons by setting those thresholds to a maximum value. Likewise, the host processor may effectively disable the UV and delta voltage negative-direction comparisons by setting those thresholds to a minimum value. For masking unused channels, a bit may be provided for each cell channel and for each GPIO channel to disable all comparisons for that channel.

The H B message's payload may also include a device count, which is initiated by the manager and is decremented by each monitor if all monitoring conversions are completed without fault and no thresholds are violated. Thus, when the HB message reaches the host processor in the event it is awakened or powered up, the host processor may determine how many devices are reporting an error of some kind based on the device count. For example, if a system includes eight devices and the HB message's device count was not decremented three times, then the host processor may determine that three devices experienced a fault/error or threshold crossing. In another example, the watchdog device may compare the final device count against an expected value and may alert the host processor if the final device count does not match the expected value.

Figure 6:
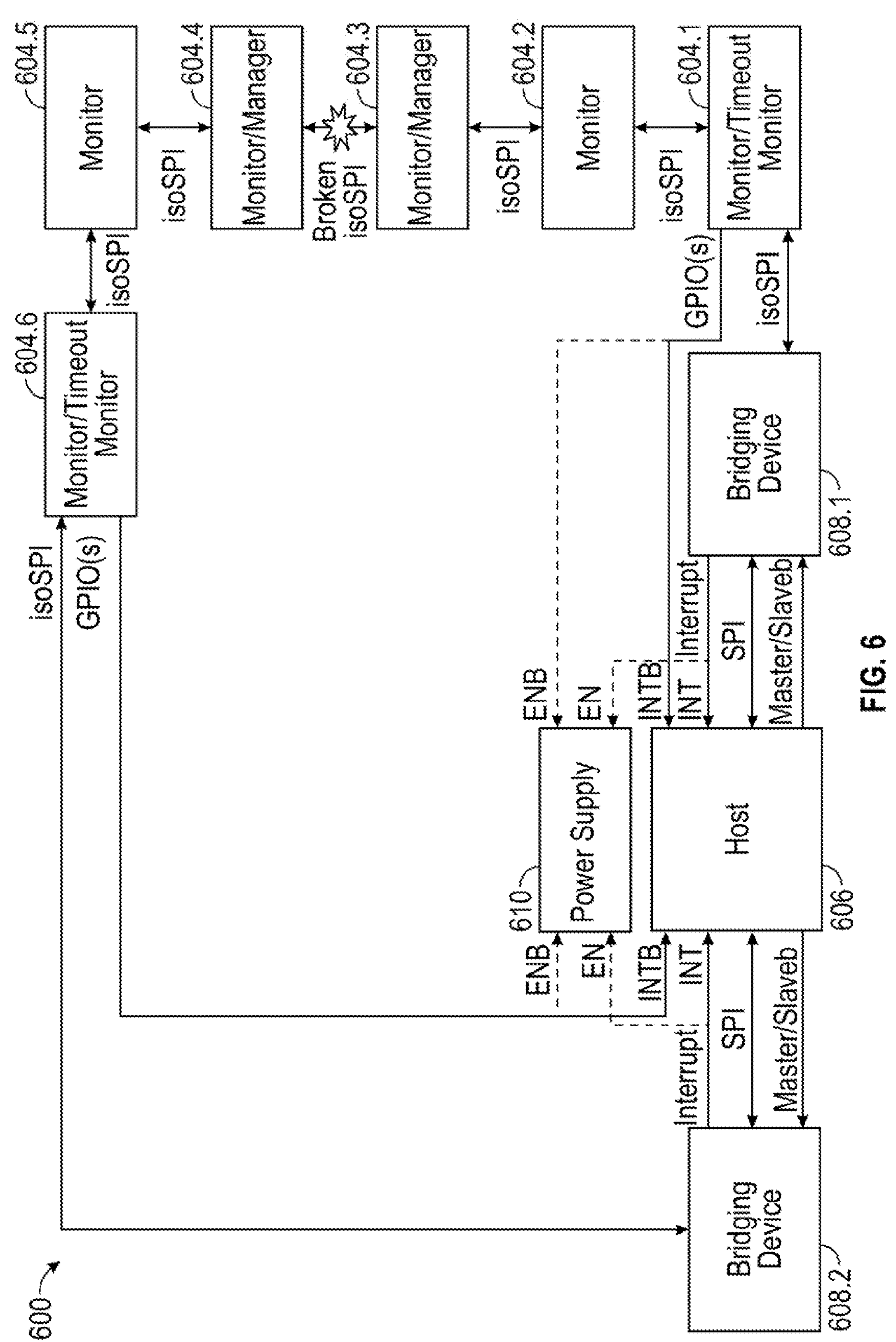
FIG. 6 illustrates a block diagram of BMS with redundant components.

Redundancy may be built into the system. Redundancy may mitigate against possible part/cabling failures. FIG. 6 illustrates a block diagram of BMS 600 with redundant components. BMS 600 may include a plurality of monitors 604.1-604.6, a host processor 606, a first bridging device 608.1, a second bridging device 608.2, and a power supply 610. Six monitors 602.1-602.6 are shown for illustration purposes only; other number of monitors may be used.

Here, for one form of redundancy, two bridging devices 608.1, 608.2 may be provided forming two reversible connections with the monitors 604.1-604.6. In one example, the BMS 600 may operate as two single chains, with each bridging device operating in conjunction with a separate manager/monitor. Two separate managers may be configured at the end of each chain. Each of the bridging devices 608.1, 608.2 may receive a HB message or times out during reduced energy consumption mode, as described herein. If the HB message indicates a fault or there is a time out, the corresponding bridging device 608.1, 608.2 may alert the host processor 606 accordingly.

Moreover, in the event of an isoSPI bus break, such as between monitor 604.3 and monitor 604.4, the host processor 606 may be alerted by a corresponding bridging device 608.1, 608.2 being used due to a watchdog timeout, as described above. In response, the host processor 606 may wake and diagnose the bus break location and reconfigure the dual-bridging device chain as two single bridging device chains. Thus, for monitors 604.1-604.3 on one side of the isoSPI break, the first bridging device 608.1 may be used to form a first chain. And for the monitors 604.4-604.6 on the other side of the isoSPI break, the second bridging device 608.2 may be used to form the second chain. In this example, the opposing-end monitors (e.g., monitor 604.3 for first chain, monitor 604.4 for second chain) on each side of the isoSPI break may be re-configurable as the manager, too.

Moreover, a second form of redundancy may be provided in the event of a bridging device failure. Here, the monitors at the ends of the battery stack (e.g., monitors 604.1 and/or 604.6) may also be configurable to operate as a bridging device emulator. Those monitors may be configurable to operate as watchdog devices, as described herein. Here, the GPIO(s) of those monitors may be configured as interrupt pins to the host processor 606 and/or power supply 610.

Figure 7:
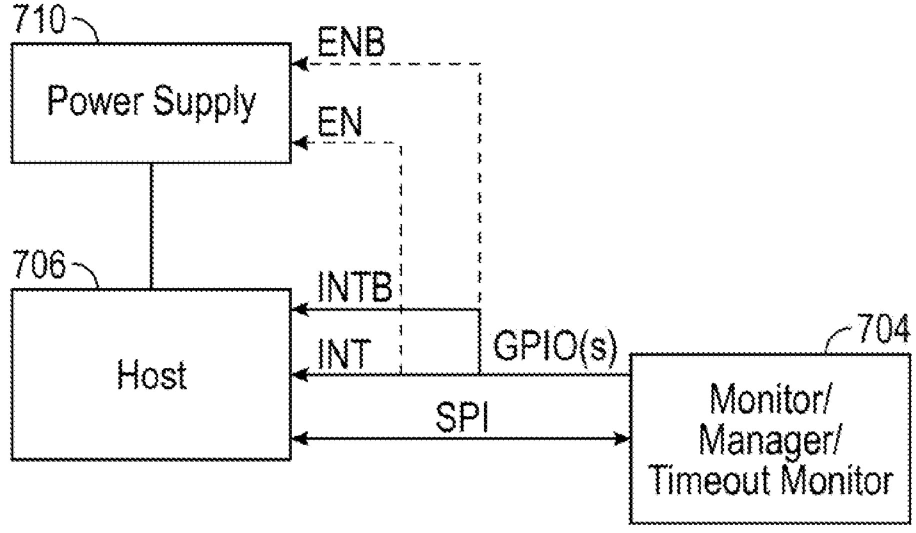
FIG. 7 illustrates a BMS monitor operating as a monitor, manager, and timeout monitor.

FIG. 7 illustrates a BMS monitor operating as a monitor, manager, and timeout monitor. Here, monitor 704 may be coupled to a host processor 706 and a power supply 710. Monitor 704 is configurable to operate as a battery monitor to perform the measurements, conversions, and comparisons as described herein. The monitor 704 is also configurable to operate as manager to initiate the HB sequence, as described herein. Moreover, the monitor 704 is configurable to operate as a timeout monitor (or watchdog device), as described herein, to analyze the HB message and alert the host processor 706 if needed. For example, the GPIO pin of monitor 704 may be configured as interrupt pins to the host processor 706 and/or power supply 710.

The battery monitoring techniques described herein provide fast and accurate delivery of the battery's state of health while consuming low amounts of power. The techniques described herein allow the host processor to remain in off or reduced energy consumption mode until a fault is detected. Moreover, the monitoring has minimal impact on cell voltages with very low supply current.

VARIOUS NOTES

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific implementations in which the invention can be practiced. These implementations are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other implementations can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed implementation. Thus, the following claims are hereby incorporated into the Detailed Description as examples or implementations, with each claim standing on its own as a separate implementation, and it is contemplated that such implementations can be combined with each other in various combinations or permutations. The scope of the invention should be determined with reference to the appended claims, along with the full scope of equivalents to which such claims are entitled.

The invention claimed is:

1. A method to monitor a battery in a reduced energy consumption mode using a plurality of monitors, the method comprising:

at a first monitor designated a manager monitor:

transitioning from a reduced energy consumption state based on a schedule;

performing a first measurement of a first battery module coupled to the first monitor;

generating a heartbeat message;

encoding information regarding the first measurement into the heartbeat message;

adjusting a count in the heartbeat message in response to no error being detected by the first monitor and not adjusting the count in response to an error being detected by the first monitor;

transmitting the heartbeat message to a second monitor; and re-entering the reduced energy consumption state;

at the second monitor:

transitioning from the reduced energy consumption state in response to an indication received from the first monitor;

receiving the heartbeat message from the first monitor;

performing a second measurement of a second battery module coupled to the second monitor;

encoding information regarding the second measurement into the heartbeat message;

adjusting the count in the heartbeat message in response to no error being detected by the second monitor and not adjusting the count in response to an error being detected by the second monitor;

at a watchdog device:

receiving the heartbeat message; and based on the count in the heartbeat message, determining whether to generate an alert for a host processor.

2. The method of claim 1, wherein the heartbeat message is transmitted between the first and second monitors using an isolated serial peripheral interface.

3. The method of claim 1, wherein performing the first measurement includes detecting an over voltage condition.

4. The method of claim 1, wherein performing the first measurement includes detecting an undervoltage condition.

5. The method of claim 1, wherein performing the first measurement includes detecting a delta voltage condition.

6. The method of claim 1, wherein the information regarding the first measurement includes whether a measured property of the first battery module is outside a specified range.

7. The method of claim 1, wherein the watchdog device is a third monitor.

8. The method of claim 1, wherein the watchdog device is a bridging device between a last monitor and the host processor.

9. A method to monitor a battery module in a reduced energy consumption mode, the method comprising:

transitioning, by a manager monitor, to a reduced energy consumption state;

based on a timer, transitioning, by the manager monitor, from the reduced energy consumption state and initiating a heartbeat sequence including performing a measurement on the battery module and comparing the measurement to a threshold;

encoding, by the manager monitor, a heartbeat message based on the comparison of the measurement to the threshold;

determining, by the manager monitor, whether an error condition exists;

adjusting, by the manager monitor, a count in the heartbeat message in response to no error condition being determined and not adjusting the count in response to the error condition being determined;

transmitting, by the manager monitor, an indication to another monitor to transition from the reduced energy consumption state;

transmitting, by the manager monitor, the heartbeat message to the another monitor; and re-entering, by the manager monitor, the reduced energy consumption state.

10. The method of claim 9, wherein the error condition is triggered by the comparison of the measurement to the threshold.

11. The method of claim 9, wherein the error condition is triggered by a diagnostic error.

12. The method of claim 9, wherein the error condition is triggered by a device count.

13. A battery management system comprising:

a host processor;

a plurality of monitors coupled to respective battery modules of a battery, wherein a first monitor of the plurality of monitors is designated a manager monitor and is configured to transition from a reduced energy mode to a consumption state and to initiate a heartbeat message based on a timer; and a watchdog device coupled to the plurality of monitors, the watchdog device configured to:

receive the heartbeat message, the heartbeat message including measurement information from a plurality of monitors and a count value indicating a number of monitors experiencing an error condition;

in response to the count value indicating that at least one monitor is experiencing the error condition, generating an alert for the host processor to exit the reduced energy consumption mode; and in response to the count value indicating that no monitor is experiencing the error condition, maintaining the host processor in the reduced energy consumption mode.

14. The battery management system of claim 13, wherein one of the plurality of monitors is configured as the watchdog device.

15. The battery management system of claim 13, wherein a first monitor of the plurality of monitors is configured to:

performing a measurement on its respective coupled battery module and comparing the measurement to a threshold;

encoding the heartbeat message based on the comparison of the measurement to the threshold;

determining whether a first error condition exists;

adjusting the count value in the heartbeat message in response to no first error condition being determined and not adjusting the count in response to the first error condition being determined;

transmitting the heartbeat message to second monitor of the plurality of monitors; and re-entering the reduced energy consumption mode.

16. The battery management system of claim 15, wherein the first monitor is configured to transmit a wakeup signal to the second monitor.

17. The battery management system of claim 16, wherein the first monitor is configured to transmit the wakeup signal to the second monitor before transmitting the heartbeat message to the second monitor.

18. The battery management system of claim 15, wherein the plurality of monitors communicate using an isolated serial peripheral interface.

19. The battery management system of claim 15, wherein the measurement information includes detecting an over voltage condition.

20. The battery management system of claim 15, wherein the measurement information includes detecting an undervoltage condition.

21. The battery management system of claim 15, wherein the measurement information includes detecting a delta voltage condition.

* * * * *